(12) United States Patent
Hada et al.

(10) Patent No.: US 7,276,575 B2
(45) Date of Patent: *Oct. 2, 2007

(54) PROCESS FOR REFINING CRUDE RESIN FOR RESIST

(75) Inventors: Hideo Hada, Kawasaki (JP); Takeshi Iwai, Kawasaki (JP); Miwa Miyairi, Kawasaki (JP); Masaaki Muroi, Kawasaki (JP); Kota Atsuchi, Kawasaki (JP); Hiroaki Tomida, Kawasaki (JP)

(73) Assignee: Tokyo Ohka Kogyo Co., Ltd., Nakahara-ku, Kawasaki-shi, Kanagawa-ken (JP)

( * ) Notice: Subject to any disclaimer, the term of this patent is extended or adjusted under 35 U.S.C. 154(b) by 168 days.

This patent is subject to a terminal disclaimer.

(21) Appl. No.: 10/544,324

(22) PCT Filed: Jan. 29, 2004

(86) PCT No.: PCT/JP2004/000807

§ 371 (c)(1),
(2), (4) Date: Aug. 3, 2005

(87) PCT Pub. No.: WO2004/069959

PCT Pub. Date: Aug. 19, 2004

(65) Prior Publication Data

US 2006/0135745 A1    Jun. 22, 2006

(30) Foreign Application Priority Data

Feb. 6, 2003   (JP) .............................. 2003-029398
Dec. 2, 2003   (JP) .............................. 2003-403133

(51) Int. Cl.
*C08F 6/00* (2006.01)

(52) U.S. Cl. .............................. 528/502 A; 430/270.1; 558/430; 560/224

(58) Field of Classification Search ............. 430/270.1; 528/502 A; 558/430; 560/224
See application file for complete search history.

(56) References Cited

U.S. PATENT DOCUMENTS

2001/0010890 A1   8/2001   Hatakeyama et al.
2001/0026901 A1   10/2001  Maeda et al.

FOREIGN PATENT DOCUMENTS

JP       06/289614      10/1994
JP       2002-201232    7/2002
WO       WO 2004/069959 8/2004

*Primary Examiner*—Terressa Boykin
(74) *Attorney, Agent, or Firm*—Knobbe Martens Olson & Bear LLP

(57) ABSTRACT

A process for refining a crude resin for a resist which is capable of effectively removing by-products such as polymers and oligomers contained within the crude resin. The refining process for the crude resin of resist resin (A) used in a photoresist composition includes at least the resist resin (A) and an acid generator (B) dissolved in a first organic solvent (C1), such that if the concentration of the component (A) in the photoresist composition is labeled X, and the crude resin concentration of the component (A) in a crude resin solution including the crude resin of the component (A) dissolved in a second organic solvent (C2) is labeled Y, then (i) the crude resin solution is prepared so that Y is smaller than X, and (ii) the crude resin solution is subsequently filtered.

20 Claims, No Drawings

PROCESS FOR REFINING CRUDE RESIN FOR RESIST

TECHNICAL FIELD

The present invention relates to a process for refining a crude resin for a resist, a resist resin produced by such a refining process, a process for producing a photoresist composition using such a resist resin, and a photoresist composition comprising such a resist resin.

BACKGROUND ART

Typical examples of resist resins used during the production of electronic devices such as semiconductor elements, liquid crystal elements and magnetic heads and the like include polyhydroxystyrene based resins (such as resins in which a portion of the hydroxyl groups are protected with acid dissociable, dissolution inhibiting groups, copolymers of hydroxystyrene units and styrene units, and copolymers of hydroxystyrene units and (meth)acrylate esters) in the case of KrF resist resins, and (meth)acrylate ester copolymer based resins in the case of ArF resist resins.

Examples of processes for refining these types of resist resins include the processes disclosed in the patent reference 1 listed below in the case of the former type polyhydroxystyrene based resins, and the processes disclosed in the patent reference 2 listed below in the case of the latter type (meth)acrylate ester copolymer based resins.

The patent reference 1 discloses a process in which the resin is dissolved in a polar solvent such as N-methylpyrrolidone and an aliphatic hydrocarbon based solvent, and following phase separation the resin is extracted from the polar solvent layer, as well as a process in which the resin is dissolved in a lower alcohol, and is then added to a poor solvent such as water to precipitate the polymer.

The patent reference 2 discloses a process in which the resin is refined using an aliphatic hydrocarbon such as n-hexane, or a mixed solvent of an aliphatic hydrocarbon and ethyl acetate.

Patent Reference 1: Japanese Unexamined Patent Application, First Publication No. Hei 6-289614 A Patent Reference 2: Japanese Unexamined Patent Application, First Publication No. 2002-201232 A However, when a crude resin for a resist is refined using these types of processes, even if the unreacted monomer is able to be removed to some extent, the removal of by-product oligomers or low molecular weight polymers, or polymers with a higher molecular weight than the targeted weight average molecular weight, is particularly difficult. Consequently, the use of resist resins containing these types of by-products that are difficult to remove as components is unavoidable.

For example, when an ArF chemically amplified photoresist composition is prepared using a resin containing the aforementioned by-product oligomers or low molecular weight polymers, or by-product polymers with a higher molecular weight than the targeted weight average molecular weight, although the various characteristics such as the sensitivity, the resolution, and the resist pattern shape are satisfactory, the number of defects in the resist pattern following developing can become problematic. These defects refer to general problems such as scum and bridging between resist patterns detected by inspecting the developed resist pattern from directly overhead using, for example, a surface defect inspection apparatus manufactured by KLA Tencor Corporation (brand name "KLA").

Furthermore, during storage as a resist solution (a photoresist composition in solution form), problems may also develop in terms of the storage stability as a resist solution, resulting in the development of fine particles within the solution. Moreover, if these fine particles develop, they can cause the type of defects described above, meaning improvements in the storage stability as a resist solution are needed in order to improve the level of defects.

DISCLOSURE OF INVENTION

The present invention takes the above problems associated with the conventional art into consideration, with an object of providing a process for refining a crude resin for a resist, which enables the effective removal of by-product oligomers or low molecular weight polymers, or by-product polymers with a higher molecular weight than the targeted weight average molecular weight, contained within the resist resin, and is capable of improving the level of defects and the storage stability as a resist solution, without impairing characteristics such as the resolution, the resist pattern shape and the sensitivity, as well as a resist resin produced by such a refining process, a process for producing a photoresist composition using such a resist resin, and a photoresist composition comprising such a resist resin.

As a result of intensive investigations aimed at resolving the above problems, the inventors of the present invention discovered that the above problems could be resolved using the devices described below, and were hence able to complete the present invention.

Namely, a first aspect of the present invention is a process for refining a crude resin of a resist resin (A) used in a photoresist composition comprising at least the resist resin (A) and an acid generator (B) dissolved in a first organic solvent (C1), wherein if the concentration of the above component (A) in the photoresist composition is labeled X, and the crude resin concentration of the component (A) in a crude resin solution comprising the crude resin of the component (A) dissolved in a second organic solvent (C2) is labeled Y, then (i) the crude resin solution is prepared so that Y is smaller than X, and (ii) the crude resin solution is subsequently filtered.

A second aspect of the present invention is a resist resin produced by the above refining process.

A third aspect of the present invention is a process for producing a photoresist composition using an aforementioned resist resin.

A fourth aspect of the present invention is a photoresist composition comprising an aforementioned resist resin.

The term "(meth)acrylic acid" refers to either one of, or both, methacrylic acid and acrylic acid. The term "structural unit" refers to a monomer unit that contributes to the formation of a polymer. The term "lactone unit" refers to a group in which one hydrogen atom has been removed from a monocyclic or polycyclic lactone. Furthermore, the term "crude resin" describes the unrefined state immediately following polymerization of a resin.

According to the present invention, there are provided a process for refining a crude resin for a resist that enables the effective removal of by-products such as polymers and oligomers contained within the resist resin, as well as a resist resin produced by such a refining process, and a process for producing a chemically amplified photoresist composition using such a resist resin.

BEST MODE FOR CARRYING OUT THE INVENTION

As follows is a sequential description of one example of a process for refining a crude resin for a resist according to the present invention.

First, a crude resin is prepared by a typical polymerization reaction. In other words, at least one monomer that generates the structural units of the target resin is first dissolved in a typical polymerization solvent. Examples of typical polymerization solvents include tetrahydrofuran, dioxane, and methyl ethyl ketone. Next, a known polymerization initiator such as azobisisobutyronitrile is added to the solution, and the polymerization is conducted by heating, preferably at 50 to 80° C., for a period of 2 to 6 hours.

Next, following completion of the polymerization reaction, the reaction liquid containing the dissolved product resin is poured into a washing solvent. As this washing solvent, for example, a polar solvent or a hydrophobic solvent can be used.

Polar solvents are solvents that contain a polar group such as a hydroxyl group, and display comparatively high hydrophilicity. Examples of such polar solvents include alcohols of 1 to 4 carbon atoms such as methanol, ethanol, n-propanol, iso-propanol, n-butanol, and tert-butanol. Of these, methanol, ethanol and iso-propanol are particularly preferred.

Hydrophobic solvents are solvents that do not contain polar groups such as hydroxyl groups, and display comparatively high hydrophobicity. Examples of hydrophobic solvents include the aliphatic hydrocarbons. Hydrocarbons of 5 to 11 carbon atoms are preferred, and specific examples include pentane, 2-methylbutane, n-hexane, 2-methylpentane, 2,2-dibutylbutane, 2,3-dibutylbutane, n-heptane, n-octane, isooctane, 2,2,3-trimethylpentane, n-nonane, 2,2,5-trimethylhexane, n-decane and n-dodecane, and of these, n-hexane and n-heptane are particularly preferred.

The quantity added of the washing solvent is preferably equivalent to at least 2-fold the mass, and preferably from 4 to 5-fold the mass of the polymerization solvent, as such quantities enable better removal of impurities such as the unreacted monomer. Following addition of the washing solvent, the mixture is preferably stirred or shaken at 10 to 40° C., and preferably from 20 to 30° C., for a period of 10 to 60 minutes, and preferably from 25 to 35 minutes, thereby precipitating the crude resin as a solid. The crude resin is obtained by filtering off this precipitated solid.

This washing step using the washing solvent can also be repeated if necessary. In other words, the resin obtained following the above washing operation can be redissolved in a polymerization solvent such as tetrahydrofuran, and the operation of pouring the solution into the washing solvent and then filtering off the precipitated resin can be repeated.

By washing the crude resin produced by the polymerization reaction with a washing solvent, in the manner described above, the majority of the unreacted monomer from the polymerization reaction can be dissolved in the washing solvent and removed. However, the removal of by-product oligomers or low molecular weight polymers from the polymerization reaction, or by-product polymers with a higher molecular weight than the targeted weight average molecular weight, and particularly compositionally biased polymers or oligomers with a high proportion of a specific structural unit, is difficult.

By employing a refining process of the present invention, and in particular the characteristic feature of the present invention wherein if the concentration of the component (A) in the photoresist composition is labeled X, and the crude resin concentration of the component (A) in a crude resin solution comprising the crude resin of the component (A) dissolved in the second organic solvent (C2) is labeled Y, then (i) the crude resin solution is prepared so that Y is smaller than X, and (ii) the crude resin solution is subsequently filtered, the types of by-products described above can be effectively removed.

There are no particular restrictions on the first organic solvent (C1) and the second organic solvent (C2) used in the present invention, provided they are capable of dissolving the resist resin, and either one, or two or more conventional resist solvents can be used.

Examples of the above organic solvents (C1) and (C2) include ketones such as acetone, methyl ethyl ketone, cyclohexanone, methyl isoamyl ketone and 2-heptanone; polyhydric alcohols and derivatives thereof such as ethylene glycol, ethylene glycol monoacetate, diethylene glycol, diethylene glycol monoacetate, propylene glycol, propylene glycol monoacetate, dipropylene glycol, or the monomethyl ether, monoethyl ether, monopropyl ether, monobutyl ether or monophenyl ether of dipropylene glycol monoacetate; cyclic ethers such as dioxane; and esters such as methyl lactate, ethyl lactate, methyl acetate, ethyl acetate, butyl acetate, methyl pyruvate, ethyl pyruvate, methyl methoxypropionate, and ethyl ethoxypropionate. These organic solvents can be used singularly, or as a mixed solvent of two or more different solvents. Furthermore, as (C1) and (C2), either the same solvent, or different solvents may be used, although from the viewpoint of efficiency during the resist composition preparation, use of the same solvent is preferred.

Of these solvents, propylene glycol monomethyl ether acetate (hereafter abbreviated as PGMEA) and ethyl lactate (hereafter abbreviated as EL) are the most widely used due to the safety they offer as resist solvents, and are consequently preferred.

There are no particular restrictions on the resist resin (A) and the acid generator (B) used in the photoresist composition, and conventional materials are suitable. Furthermore, the expression "at least" means that other typically employed optional components may be included in the photoresist composition in addition to the aforementioned component (A) and component (B).

The concentration X of the component (A) in the photoresist composition is the concentration of the resist resin (A) in the photoresist composition in solution form, produced by dissolving at least the refined component (A) and the component (B) in the component (C1).

There are no particular restrictions on the resist resin concentration within a photoresist composition suitable for use with an exposure source with a wavelength of no more than 248 nm (such as KrF, ArF or $F_2$ excimer laser light, or other radiation such as extreme UV, EB (electron beam) or X-ray radiation), although the composition is preferably prepared with a resin concentration of 5 to 25% by weight, and even more preferably from 7 to 20% by weight. If the concentration falls outside this range, then forming a film thickness that is appropriate for the exposure source may become difficult.

The crude resin concentration Y of the component (A) in a crude resin solution comprising the crude resin of the component (A) dissolved in the second organic solvent (C2) is, as the description suggests, the concentration of the component (A) in the crude resin solution comprising the unrefined crude resin of the component (A) dissolved in (C2).

The refining process of the present invention requires that (i) the crude resin solution is prepared so that Y is smaller than X, and (ii) the crude resin solution is subsequently filtered.

The solution is prepared so that as described above, Y is smaller than X, although there are no particular restrictions on the value of Y. The actual value of Y need only be less than the actual value of X selected from the aforementioned concentration range of 5 to 25% by weight, and even more preferably from 7 to 20% by weight Y values within a range from 2 to 10% by weight are even more preferred, and values from 6 to 10% by weight are the most preferred. By first preparing a solution of the crude resist resin that is more dilute than the concentration of the resist resin in the final photoresist composition, by-products can be precipitated out of this dilute resist solution.

Subsequently, the crude resin solution is filtered.

Filtering of the crude resin solution can be conducted using conventional methods, although filtration through a filter with a filtration membrane is preferred. There are no particular restrictions on the material for the filtration membrane, which can be any material typically used in the filtration of photoresist compositions, and specific examples include fluororesins such as PTFE (polytetrafluoroethylene); polyolefin resins such as polypropylene and polyethylene; and polyamide resin such as nylon 6 and nylon 66. Of these, polyethylene, polypropylene, nylon 66 and nylon 6 are preferred, as they offer superior removal of oligomers and low molecular weight polymers, or polymers with a higher molecular weight than the targeted weight average molecular weight, which are produced as by-products in the polymerization reaction, and as a result provide a superior defect reduction effect and superior storage stability as a resist solution.

The pore size of the above filter is preferably within a range from 0.02 to 0.1 µm, and even more preferably from 0.02 to 0.05 µm, as such sizes offer the most effective removal of the above by-products. If the filter pore size is less than 0.02 µm, then the filtration speed becomes overly slow, and there is a danger of an undesirable fall in productivity. In contrast if the pore size exceeds 0.1 µm, there is a danger that the oligomers and low molecular weight polymers, or polymers with a higher molecular weight than the targeted weight average molecular weight, produced as by-products in the polymerization reaction will not be effectively removed.

Furthermore, passing the crude resist resin solution described above through a two-stage filter using filtration membranes offers even more effective removal of the polymer and oligomer by-products, and results in an even more superior defect reduction effect and even better storage stability as a resist solution, and is consequently the most preferred option. In one specific example of the filtering process, the dilute crude resin solution is filtered through a nylon filter as the first filtration step, and the resulting filtrate is then filtered through a polypropylene filter as the second filtration step. A polyethylene filter could also be used in this second filtration step. Specific examples of the above nylon filter include ULTIPORE N66 (brand name: manufactured by Nihon Pall Ltd.) which is manufactured from NYLON 66 (brand name), and the ULTIPLEAT P-NYLON FILTER (brand name: manufactured by Nihon Pall Ltd., pore size 0.04 µm) which is also manufactured from NYLON 66 (brand name).

By removing a predetermined quantity of solvent from the filtrate containing the refined target resin, and adjusting the concentration of the resist resin within the photoresist composition to the desired level, the filtrate can be used, as is, as the resist resin solution for the photoresist, which is the preferred option. The photoresist composition can then be produced efficiently by simply adding the acid generator component and any other optional components to the resist solution. Alternatively, the solvent could also be removed completely, and the resulting solid resin then used in the subsequent production of the photoresist composition.

In a process for refining a crude resin for a resist according to the present invention, the order in which the aforementioned washing process using a washing solvent, and the aforementioned steps (i) and (ii) are performed may also be reversed.

Carrying out the above washing process step using the washing solvent first, to produce a solid crude resin from which monomers and the like have been removed, and then conducting the aforementioned steps (i) and (ii) is preferred as it results in a more effective removal of by-products such as oligomers and polymers.

The process for refining a crude resin for a resist according to the present invention is used for refining resins used in photoresist compositions. There are no particular restrictions on these resist resins, and suitable examples include hydroxystyrene based resins and (meth)acrylate based resins, although resins produced by a radical polymerization reaction are preferred. In addition, the present invention is also suited to the production of resins that can be used in chemically amplified photoresist compositions, and particularly resins containing structural units derived from (meth)acrylate esters. Examples of resins containing structural units derived from (meth)acrylate esters include, for example, the resin components of photoresist compositions suitable for use with ArF excimer lasers.

Specifically, the refining process of the present invention is preferably used in the production of resins containing the structural units (a1) described below.

(a1) Structural units derived from a (meth)acrylate ester containing a hydrophilic site (hereafter referred to as (a1) units).

(a1) Units:

An (a1) unit is a structural unit containing a hydrophilic site on the ester side chain section of a (meth)acrylate ester. There are no particular restrictions on the hydrophilic site, although lactone units are particularly preferred. In the lactone unit, the ring containing the —O—C(O)— structure is counted as the first ring. Accordingly, the case in which the only ring structure is the ring containing the —O—C(O)— structure is referred to as a monocyclic group, and groups containing also other ring structures are described as polycyclic groups regardless of the structure of the other rings.

Specific examples of the (a1) unit include monocyclic groups in which one hydrogen atom has been removed from γ-butyrolactone, and polycyclic groups in which one hydrogen atom has been removed from a lactone containing bicycloalkane.

Specifically, the structural units represented by the structural formulas (I) to (IV) shown below are preferred.

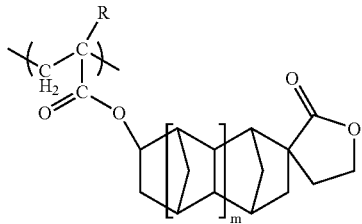

(I)

(wherein, R represents a hydrogen atom or a methyl group, and m represents either 0 or 1)

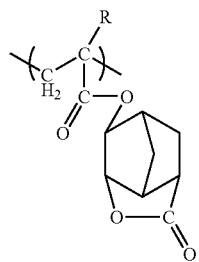

(II)

(wherein, R represents a hydrogen atom or a methyl group)

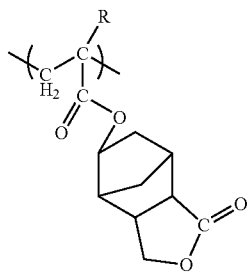

(III)

(wherein, R represents a hydrogen atom or a methyl group)

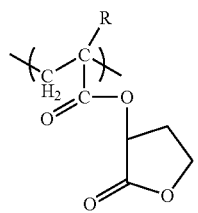

(IV)

(wherein, R represents a hydrogen atom or a methyl group)

The above structural units (a1) preferably account for 20 to 60 mol %, and even more preferably from 30 to 50 mol % of the total of all the structural units within the resin, as such proportions result in superior resolution.

In those cases in which the resist resin to which the refining process of the present invention is applied is a resin comprising the (a1) units described above, the raw material monomers are preferably monomers containing a lactone unit with a comparatively high level of hydrophilicity. When production of a resin is conducted using such a monomer, oligomers and low molecular weight polymers comprising a large proportion of structural units containing a lactone unit, or polymers comprising a large proportion of structural units containing a lactone unit and with a higher molecular weight than the targeted weight average molecular weight are generated as by-products. Because these highly hydrophilic oligomers and polymers and the like typically display poor solubility in resist solvents, application of the production process of the present invention in these cases is particularly desirable. By filtering a dilute resin solution, the highly hydrophilic oligomers and polymers can be removed effectively. This enables a reduction in the level of defects, and an improvement in the storage stability of the resin, both of which cause problems in chemically amplified photoresists.

A resist resin to which the refining process of the present invention is applied preferably comprises structural units (a2) described below.

(a2) Structural units derived from a (meth)acrylate ester containing a hydrophobic group (hereafter referred to as (a2) units).

(a2) Units:

The hydrophobic group within the (a2) unit refers to a highly hydrophobic hydrocarbon group containing at least 6 carbon atoms, and preferably 10 or more carbon atoms, contained within the ester section of the (meth)acrylate ester. The hydrocarbon group may be either a chain-type or a cyclic hydrocarbon group, and specific examples include a hydrophobic group containing a tertiary alkyl group, a monocyclic group, or a polycyclic group. Of these, aliphatic type monocyclic or polycyclic hydrocarbon groups are preferred, and polycyclic hydrocarbon groups are particularly preferred as they result in superior resolution and dry etching resistance.

Examples of these (a2) units include the structural units (a2-1) and (a2-2) described below.

(a2-1) Structural units derived from a (meth)acrylate ester comprising an acid dissociable, dissolution inhibiting group containing a hydrophobic aliphatic monocyclic or polycyclic group (hereafter referred to as (a2-1) units).

(a2-2) Structural units derived from a (meth)acrylate ester comprising a non-acid dissociable group containing a hydrophobic aliphatic polycyclic group (hereafter referred to as (a2-2) units).

The term "non-acid dissociable" used in the description of the (a2-2) units does not mean that the group is chemically completely non-dissociable, but rather that the level of acid dissociability is lower than that of an (a2-1) unit and results in no significant resist patterning.

(a2-1) Units:

In terms of the acid dissociable, dissolution inhibiting group containing a monocyclic or polycyclic group that is used as the hydrophobic group in the (a2-1) unit, suitable examples of the aliphatic monocyclic group include groups in which one hydrogen atom has been removed from a cycloalkane, and suitable examples of the aliphatic polycyclic group include groups in which one hydrogen atom has been removed from a bicycloalkane, a tricycloalkane or a tetracycloalkane or the like.

Specific examples include groups in which one hydrogen atom has been removed from cyclohexane in the case of an aliphatic monocyclic group, and groups in which one hydrogen atom has been removed from a polycycloalkane such as adamantane, norbornane, isobornane, tricyclodecane or tetracyclododecane in the case of an aliphatic polycyclic group.

This polycyclic group can be appropriately selected from the multitude of acid dissociable, dissolution inhibiting groups proposed for use within ArF excimer laser photoresist composition resins.

Of these groups, cyclohexyl groups, adamantyl groups, norbornyl groups, and tetracyclododecanyl groups are preferred in terms of industrial availability.

There are no particular restrictions on the above acid dissociable, dissolution inhibiting group, providing it is a group which can be used in a resin for a positive chemically amplified photoresist composition, and which dissociates under the action of acid, causing the resin to shift from an alkali insoluble state to an alkali soluble state.

Typically, groups in which a cyclic or a chain-type tertiary alkyl ester is formed at the carboxyl group of the (meth)acrylic acid are the most widely used.

Specifically, the structural unit (a2-1) is preferably at least one unit selected from a group consisting of the general formulas (V) to (VII) shown below.

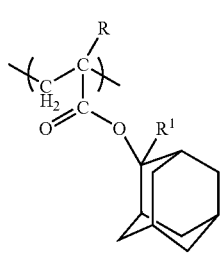

(V)

(wherein, R represents a hydrogen atom or a methyl group, and $R^1$ represents a lower alkyl group)

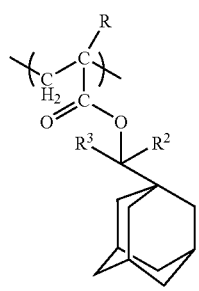

(VI)

(wherein, R represents a hydrogen atom or a methyl group, and $R^2$ and $R^3$ each represent, independently, a lower alkyl group)

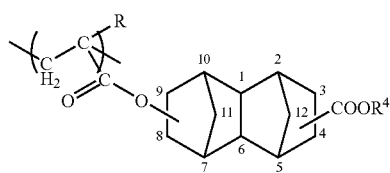

(VII)

(wherein, R represents a hydrogen atom or a methyl group, and $R^4$ represents a tertiary alkyl group)

Within the above formula, the group $R^1$ is preferably a straight chain or branched alkyl group of 1 to 5 carbon atoms, and specific examples include a methyl group, ethyl group, propyl group, isopropyl group, n-butyl group, isobutyl group, tert-butyl group, pentyl group, isopentyl group and neopentyl group. Of these, an alkyl group of at least 2 carbon atoms, and preferably from 2 to 5 carbon atoms, is preferred as it provides an acid dissociability that is greater than the case in which $R^1$ is a methyl group, and enables higher sensitivity. From an industrial viewpoint, a methyl group or an ethyl group is preferred.

The aforementioned groups $R^2$ and $R^3$ each preferably represent, independently, a lower alkyl group of 1 to 5 carbon atoms. These types of groups tend to display a higher acid dissociability than a 2-methyl-2-adamantyl group.

Specifically, the groups $R^2$ and $R^3$ preferably each represent, independently, the same types of straight chain or branched lower alkyl groups described above for $R^1$. Of these groups, the case in which $R^2$ and $R^3$ are both methyl groups is preferred in terms of industrial availability, and specific example of the structural unit represented by the formula (VI) includes structural unit derived from 2-(1-adamantyl)-2-propyl (meth)acrylate.

The group $R^4$ represents a tertiary alkyl group such as a tert-butyl group or a tert-amyl group, although a tert-butyl group is preferred in terms of industrial availability.

Furthermore, the group —$COOR^4$ may be bonded to either position 3 or 4 of the tetracyclododecanyl group shown in the formula, although a mixture of both stereoisomers results, and so the bonding position cannot be further specified. Furthermore, the carboxyl group residue of the (meth)acrylate structural unit may be bonded to either position 8 or 9, although similarly, the bonding position cannot be further specified.

The above structural units (a2-1) preferably account for 20 to 60 mol %, and even more preferably from 30 to 50 mol % of the total of all the structural units within the resin, as such proportions result in superior resolution.

(a2-2) Units:

(a2-2) units comprise a non-acid dissociable group containing a hydrophobic aliphatic polycyclic group.

Examples of the aliphatic polycyclic group include the same groups described above in relation to the (a2-1) units, and any of the multitude of conventional groups proposed for use within ArF excimer laser photoresist composition resins can be used.

From the viewpoint of industrial availability, at least one of a tricyclodecanyl group, an adamantyl group or a tetracyclododecanyl group is preferred.

Specific examples of the (a2-2) unit include the units with the structures (VIII) to (X) shown below.

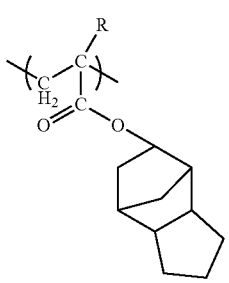

(VIII)

(wherein, R represents a hydrogen atom or a methyl group)

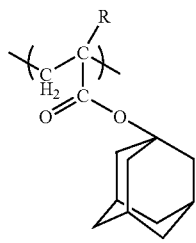

(IX)

(wherein, R represents a hydrogen atom or a methyl group)

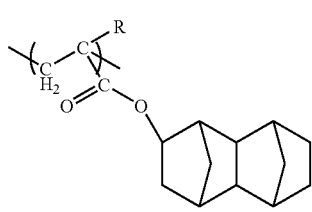

(X)

(wherein, R represents a hydrogen atom or a methyl group)

The above structural units (a2-2) preferably account for 1 to 30 mol %, and even more preferably from 5 to 20 mol % of the total of all the structural units within the resin, as such proportions result in excellent resolution for isolated patterns through to semi dense patterns.

In those cases in which the resist resin to which the refining process of the present invention is applied is a resin comprising the (a2) units described above, monomers containing a hydrophobic group are used as the raw material monomers. When production of a resin is conducted using such monomers, highly hydrophobic oligomers and low molecular weight polymers comprising a large proportion of structural units containing a hydrophobic group are generated as by-products. In addition, highly hydrophobic polymers comprising a large proportion of structural units containing a hydrophobic group are also generated as by-products. Because these highly hydrophobic oligomers and polymers and the like typically display poor solubility in resist solvents, application of the production process of the present invention, namely filtering a dilute solution of the resin to enable the highly hydrophobic oligomers and polymers to be removed effectively, can be favorably employed, enabling a further improvement in the defect reduction effect.

Suitable crude resins for use with a refining process of the present invention preferably comprise both the aforementioned (a1) units and the aforementioned (a2) units.

Furthermore, the crude resin may also comprise another structural unit (a3) in addition to the (a1) units and (a2) units described above.

There are no particular restrictions on the (a3) unit, provided it cannot be classified as one of the above units (a1) and (a2). For example, structural units derived from a (meth)acrylate ester comprising a hydroxyl group containing aliphatic polycyclic group are preferred.

The aliphatic polycyclic group may be appropriately selected from the plurality of polycyclic groups listed in the description of the above structural unit (a1).

Specifically, hydroxyl group containing adamantyl groups or carboxyl group containing tetracyclododecanyl groups are preferred as the structural unit (a3).

More specific examples include the structural units represented by the general formula (XI) shown below. The (a3) units preferably account for 5 to 50 mol %, and even more preferably from 10 to 40 mol % of the total of all the structural units within the resin, as such proportions result in a superior resist pattern shape when the resin is used as a chemically amplified photoresist resin.

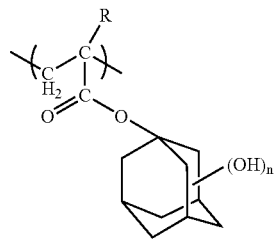

(XI)

(wherein, R represents a hydrogen atom or a methyl group, and n represents an integer of 1 to 3)

In addition, a crude resin for a resist suitable for use with a refining process of the present invention may comprise two types of units, namely, acrylate ester units and methacrylate ester units, and combinations of these two units resulting in three types of crude resin, namely, resins containing only acrylate ester units, resins containing only methacrylate ester units, and resins containing both types of units The refining process of the present invention is particularly suited to resins containing only structural units derived from methacrylate esters, and resins containing from 20 to 70 mol % of structural units derived from acrylate esters, and from 30 to 80 mol % of structural units derived from methacrylate esters.

In addition, the latter type of resins containing structural units derived from acrylate esters and structural units derived from methacrylate esters in a specific ratio are prone to the production of oligomer and low molecular weight polymer by-products of differing polarity, due to the difference in polarity of the structural units derived from acrylate esters and the structural units derived from methacrylate esters, although these types of by-products can also be effectively removed using a refining process of the present invention.

As follows is a description of a chemically amplified photoresist composition that can be readily produced using a resist resin obtained by the refining process of the present invention described above.

This chemically amplified photoresist composition comprises (A) a resin component (hereafter referred to as component (A)), (B) an acid generator component that generates acid on exposure (hereafter referred to as component (B)), and (C1) a first organic solvent (hereafter referred to as component (C1)). In those cases when a resist resin of the present invention is used as a photoresist composition, the component (A) is either an alkali soluble resin or a resin that can be converted to an alki soluble state. The former case is a so-called negative photoresist composition, and the latter case a so-called positive photoresist composition.

In the case of a negative type composition, a cross linking agent is added to the photoresist composition with the component (B). Then, during resist pattern formation, when acid is generated from the component (B) by exposure, this acid acts on the cross linking agent, causing cross linking between the component (A) and the cross linking agent, and making the composition alkali insoluble. As the cross linking agent, either a compound with a methylol group or an alkyl ether thereof, including amino based resins such as melamine resin, urea resin or glycoluril resin is typically used. In the case of a positive type composition, the component (A) is an alkali insoluble resin with a so-called acid dissociable, dissolution inhibiting group, and when acid is generated from the component (B) by exposure, this acid causes the acid dissociable, dissolution inhibiting group to dissociate, making the component (A) alkali soluble. In this case, the resin must comprise (a1) units and (a2-1) units.

Component (A):

As the component (A), the above types of resist resins, obtained using the process for refining a resist resin according to the present invention, are used.

There are no particular restrictions on the polystyrene equivalent weight average molecular weight of the component (A), as determined by GPC, although values within a range from 5,000 to 30,000 are preferred, and values from 8,000 to 20,000 are even more desirable.

Furthermore, the component (A) can be formed from either one, or two or more different resins, and for example, as the component (A), one or two or more of the above types of resins comprising units derived from (meth)acrylate esters as the principal components may be utilized, or mixtures with other conventional photoresist composition resins may also be utilized.

Component (B):

The component (B) can be appropriately selected from known materials used as acid generators in conventional positive and negative chemically amplified resists.

Specific examples include onium salts such as diphenyliodonium trifluoromethanesulfonate, (4-methoxyphenyl)phenyliodonium trifluoromethanesulfonate, bis(p-tert-butylphenyl)iodonium trifluorometlanesulfonate, triphenylsulfonium trifluoromethanesulfonate, (4-methoxyphenyl)diphenylsulfonium trifluoromethanesulfonate, (4-methylphenyl)diphenylsulfonium nonafluorobutanesulfonate, (p-tert-butylphenyl)diphenylsulfonium trifluoromethanesulfonate, diphenyliodonium nonafluorobutanesulfonate, bis(p-tert-butylphenyl)iodonium nonafluorobutanesulfonate and triphenylsulfonium nonafluorobutanesulfonate. Of these, onium salts with a fluorinated alkylsulfonate ion as the anion are preferred.

As this component (B), a single compound, or a combination of two or more compounds may be utilized. The quantity of the component (B) is typically within a range from 0.5 to 30 parts by weight per 100 parts by weight of the component (A).

Component (C1):

The component (C1) can be any solvent capable of dissolving the component (A) and the component (B) to generate a uniform solution, and the solvent used can be one, or two or more solvents selected from amongst known solvents used for conventional chemically amplified resists.

Specific examples of the solvent include ketones such as acetone, methyl ethyl ketone, cyclohexanone, methyl isoamyl ketone and 2-heptanone; polyhydric alcohols and derivatives thereof such as ethylene glycol, ethylene glycol monoacetate, diethylene glycol, diethylene glycol monoacetate, propylene glycol, propylene glycol monoacetate, dipropylene glycol, or the monomethyl ether, monoethyl ether, monopropyl ether, monobutyl ether or monophenyl ether of dipropylene glycol monoacetate; cyclic ethers such as dioxane; and esters such as methyl lactate, ethyl lactate, methyl acetate, ethyl acetate, butyl acetate, methyl pyruvate, ethyl pyruvate, methyl methoxypropionate, and ethyl ethoxypropionate. These organic solvents can be used singularly, or as a mixed solvent of two or more different solvents.

Of these solvents, propylene glycol monomethyl ether acetate (PGMEA) and ethyl lactate (EL) and the like are preferred.

The quantity of the component (Cl) is sufficient to generate a concentration that is suitable for use as a photoresist composition, and enables application of the composition to a substrate or the like.

Other Components:

Other components may also be added to the photoresist composition according to need.

For example, in order to improve the resist pattern shape and the long term stability (post exposure stability of the latent image formed by the pattern wise exposure of the resist layer), an amine, and particularly a secondary lower aliphatic amine or a tertiary lower aliphatic amine, can also be added as an optional component (D).

Here, a lower aliphatic amine refers to an alkyl or alkyl alcohol amine of no more than 5 carbon atoms, and examples of these secondary and tertiary amines include trimethylamine, diethylamine, triethylamine, di-n-propylamine, tri-n-propylamine, tripentylamine, diethanolamine and triethanolamine, and alkanolamines such as triethanolamine are particularly preferred.

These may be used singularly, or in combinations of two or more different compounds.

This amine is typically added in a quantity within a range from 0.01 to 5.0 parts by weight per 100 parts by weight of the component (A).

Furthermore, in line with the objectives of preventing any deterioration in sensitivity, and improving the resist pattern shape and the long term stability by adding the component (D), an organic carboxylic acid, or a phosphorus oxo acid or derivative thereof can also be added as an optional component E). Either one, or both of the component (D) and the component (E) can be used.

Examples of suitable organic carboxylic acids include malonic acid, citric acid, malic acid, succinic acid, benzoic acid, and salicylic acid.

Examples of suitable phosphorus oxo acids or derivatives thereof include phosphoric acid or derivatives thereof such as esters, including phosphoric acid, di-n-butyl phosphate and diphenyl phosphate; phosphonic acid or derivatives thereof such as esters, including phosphonic acid, dimethyl phosphonate, di-n-butyl phosphonate, phenylphosphonic acid, diphenyl phosphonate and dibenzyl phosphonate; and phosphinic acid or derivatives thereof such as esters, including phosphinic acid and phenylphosphinic acid, and of these, phosphonic acid is particularly preferred.

The component (E) is typically used in a quantity within a range from 0.01 to 5.0 parts by weight per 100 parts by weight of the component (A).

Miscible additives can also be added to a photoresist composition of the present invention according to need, including additive resins for improving the properties of the resist film, surfactants for improving the ease of application, dissolution inhibitors, plasticizers, stabilizers, colorants and halation prevention agents.

Production of the chemically amplified photoresist composition can be conducted by simply mixing and stirring each of the components together using conventional methods, and where required, the composition may also be mixed and dispersed using a dispersion device such as a dissolver, a homogenizer, or a triple roll mill. Furthermore, following mixing, the composition may also be filtered using a mesh or a membrane filter or the like.

Particularly in the case of a positive photoresist composition for use with an ArF excimer laser, a resin containing both (a1) units and (a2-1) units must be used, and resins that also contain (a3) units, and in some cases (a2-2) units, are preferred as they provide superior characteristics of sensitivity, resolution, and resist pattern shape. In those cases when this type of resin, formed by the polymerization of monomers of differing polarity, is used, it is thought that various monomers, oligomers, polymers, and other by-products within the resin have a deleterious effect on the long term stability of the photoresist composition. Accordingly, a chemically amplified photoresist composition produced using a resist resin according to the present invention displays favorable storage stability as a resist solution, and is less likely to produce defects during resist pattern formation.

Furthermore, in recent years silicon wafers have increased in size considerably, and attempts are being made to introduce 300 mm wafers, and with this type of large diameter substrate, in order to prevent wastage of the resist composition, a step known as a "prewet step" is used to drop a known resist solvent onto the substrate in advance, before application of the resist composition.

Until now, defects have developed during this prewetting of the resist, causing a considerable problem, but with the resist composition of the present invention, a superior defect reduction effect can be achieved even when a prewet step is conducted.

The storage stability as a resist solution is evaluated using a liquid particle counter (brand name: Particle Sensor KS-41, manufactured by Rion Co., Ltd.), using a photoresist composition sample that has been stored at room temperature following production. The above counter is a device for counting the number of particles with a particle diameter of at least 0.2 μm, within each 1 $cm^3$. The measurement upper limit is typically approximately 20,000 particles/$cm^3$.

The quantity of particles within a photoresist composition immediately following production is typically restricted to no more than 10 to 30 particles/$cm^3$. By utilizing the present invention, the storage stability as a resist solution after storage for half a year is preferably essentially unchanged from the stability immediately following production.

A resist pattern using the above type of photoresist composition can be formed using typical methods.

For example, a photoresist composition described above is first applied to the surface of a substrate such as a silicon wafer using a spinner or the like, and a prebake (heat treatment prior to exposure) is conducted under temperature conditions of 80 to 150° C. for 40 to 120 seconds, and preferably for 60 to 90 seconds. Following selective exposure of the resist film with an exposure apparatus, by irradiating KrF, ArF or $F_2$ excimer laser light, or other radiation such as extreme UV, EB (electron beam) or X-ray radiation, through a desired mask pattern, PEB (post exposure baking) is conducted under temperature conditions of 80 to 150° C. for 40 to 120 seconds, and preferably for 60 to 90 seconds. Subsequently, developing is conducted using an alkali developing liquid such as an aqueous solution of tetraethylammonium hydroxide with a concentration of 0.1 to 10% by weight. In this manner, a resist pattern that is faithful to the mask pattern can be obtained.

An organic or inorganic anti-reflective film may also be provided between the substrate and the applied layer of the resist composition.

Defects within the resist pattern can be evaluated by the number of so-called surface defects, measured using, for example, a KLA2132 (brand name) surface defect inspection apparatus manufactured by KLA Tencor Corporation.

EXAMPLES

As follows is a more detailed description of the present invention using a series of examples.

The physical properties of the photoresist compositions in each of the following examples and comparative examples were determined in the following manner.

(1) Storage Stability as a Resist Solution

The storage stability as a resist solution of a photoresist composition that had been stored at room temperature (for 3 months) following production was evaluated using a liquid particle counter (brand name: KS-41, manufactured by Rion Co., Ltd.).

Measurement upper limit is approximately 20,000 particles/$cm^3$.

Furthermore, the quantity of particles within a photoresist composition immediately following production was restricted to no more than 10 particles/$cm^3$.

(2) Defects

The prepared photoresist composition (a positive type composition) was applied to a silicon wafer (diameter 200 mm) using a spinner, and was then prebaked and dried on a hotplate at 130° C. for 90 seconds, forming a resist layer with a film thickness of 350 nm.

Subsequently, this layer was selectively irradiated with an ArF excimer laser (193 nm) through a mask pattern, using an ArF exposure apparatus NSR-S302 (manufactured by Nikon Corporation, NA (numerical aperture)=0.60, σ=0.75).

The irradiated resist was then subjected to PEB treatment at 120° C. for 90 seconds, subsequently subjected to puddle development for 60 seconds at 23° C. in a 2.38% by weight aqueous solution of tetramethylammonium hydroxide, and was then washed for 20 seconds with water, and dried, forming a 250 nm line and space pattern.

The number of defects was then measured using a KLA2132 (brand name) surface defect inspection apparatus manufactured by KLA Tencor Corporation, thus evaluating the number of defects within the wafer. Three wafers were used in each example and comparative example, and the average value was reported.

Example 1

The monomers (1) to (3) described below were dissolved in 400 ml of tetrahydrofuran, 1.64 g of azobisisobutyronitrile was added as a reaction initiator, and a polymerization reaction was conducted for 3 hours at 70° C.

(1) 40 mol %, 13.6 g of α-gamma-butyrolactone methacrylate (corresponding with the structural unit (a1), and equivalent to the monomer of the above general formula (IV) wherein R is a methyl group)

(2) 40 mol %, 18.7 g of 2-methyl-2-adamantyl methacrylate (corresponding with the structural unit (a2-1), and equivalent to the monomer of the above general formula (V) wherein R and $R^1$ are methyl groups)

(3) 20 mol %, 9.44 g of 3-hydroxy-1-adamantyl methacrylate (corresponding with the structural unit (a3), and equivalent to the monomer of the above general formula (XI) wherein R is a methyl group, n=1, and a hydroxyl group is bonded to position 3 of the adamantyl group)

Following completion of the polymerization, the reaction liquid was poured into 2500 ml of methanol, the resulting mixture was stirred for 30 minutes at 25° C., and the precipitated solid was collected by filtration. This solid was then redissolved in 400 ml of tetrahydrofuran, poured into 2500 ml of methanol, the resulting mixture was stirred for 30 minutes at 25° C., and the precipitated crude resin was collected by filtration (the washing step).

30 g of the crude resin obtained in the manner described above was dissolved in 345 ml of PGMEA to prepare an 8% by weight (equivalent to Y) dilute resist resin solution. This dilute resist resin solution was filtered through a nylon filter (brand name: ULTIPORE N66, manufactured by Nihon Pall Ltd.) with a pore size of 0.04 μm. Subsequently, the thus obtained filtrate was filtered through a polypropylene filter (brand name: UNIPORE-POLYFIX, manufactured by Kitz Corporation) with a pore size of 0.02 μm (the refining step). The resulting filtrate was concentrated and yielded a resist resin (A-1). The weight average molecular weight of (A-1) was 10,000. Analysis of a sample removed from the above washing step resulted in the detection of each of the above monomers (1), (2) and (3). Furthermore, analysis of a sample removed from the above refining step resulted in the detection of oligomers and polymers in which the proportions of the monomers (1), (2) and (3) were biased relative to the initial addition proportions.

The components (A) to (D) described below were mixed together and dissolved to prepare a chemically amplified photoresist composition (a positive composition for use with an ArF excimer laser). The photoresist composition was prepared so that whereas the concentration (Y) of the resist resin prior to filtering was 8% by weight, the concentration (X) of the resist resin in the resist composition was approximately 11% by weight, meaning Y was smaller than X.

Component (A): 100 parts by weight of (A-1) obtained above

Component (B): 3.0 parts by weight of triphenylsulfonium nonafluorobutanesulfonate Component (C): 800 parts by weight of a mixed solvent of PGMEA and ethyl lactate (weight ratio 6:4)

Component (D): 0.1 parts by weight of triethanolamine

The storage stability as a resist solution of the photoresist composition after storage for 3 months at room temperature was essentially unchanged from the stability observed immediately following production.

The number of pattern defects averaged no more than 5 defects per wafer. Using a measuring SEM S-9220 (manufactured by Hitachi, Ltd.), the defects were identified as so-called bridge type defects in which bridging occurs between line patterns.

Example 2

With the exception of using the monomers (1) to (4) described below, a photoresist resin (A-2) was synthesized by polymerization in the same manner as the example 1, and following washing and refining, a photoresist composition was prepared in the same manner as the example 1. The storage stability as a resist solution and the quantity of defects were then evaluated. The weight average molecular weight of the refined resist resin was 10,000.

(1) 40 mol % of norbomanelactone acrylate (corresponding with the structural unit (a1), and equivalent to the monomer of the above structural formula (II) wherein R is a hydrogen atom)

(2) 35 mol % of 2-ethyl-2-adamantyl methacrylate (corresponding with the structural unit (a2-1), and equivalent to the monomer of the above general formula (V) wherein R is a methyl group, and $R^1$ is an ethyl group)

(3) 15 mol % of 3-hydroxy-1-adamantyl acrylate (corresponding with the structural unit (a3), and equivalent to the monomer of the above general formula (XI) wherein R is a hydrogen atom, n=1, and a hydroxyl group is bonded to position 3 of the adamantyl group)

(4) 10 mol % of tetracyclododecane methacrylate (corresponding with the structural unit (a2-2), and equivalent to the monomer unit of the above general formula (X) wherein R is a methyl group)

Analysis of a sample removed from the above washing step resulted in the detection of each of the above monomers (1), (2), (3) and (4). Furthermore, analysis of a sample removed from the above refining step resulted in the detection of oligomers and polymers in which the proportions of the monomers (1), (2), (3) and (4) were biased relative to the initial addition proportions.

The storage stability as a resist solution of the photoresist composition after storage for 3 months at room temperature was essentially unchanged from the stability observed immediately following production.

The number of pattern defects averaged no more than 5 defects per wafer. Using a measuring SEM S-9220 (manufactured by Hitachi, Ltd.), the defects were identified as so-called bridge type defects in which bridging occurs between line patterns.

Example 3

With the exception of using the monomers (1) to (4) described below, a photoresist resin (A-3) was synthesized by polymerization in the same manner as the example 1, and following washing and refining, a photoresist composition was prepared in the same manner as the example 1. The storage stability as a resist solution and the quantity of defects were then evaluated. The weight average molecular weight of the refined resist resin was 10,000.

(1) 35 mol % of α-gamma-butyrolactone methacrylate (corresponding with the structural unit (a1))

(2) 35 mol % of 2-methyl-2-adamantyl methacrylate (corresponding with the structural unit (a2-1))

(3) 15 mol % of 3-hydroxy-1-adamantyl methacrylate (corresponding with the structural unit (a3))

(4) 15 mol % of tetracyclododecane methacrylate (corresponding with the structural unit (a2-2))

Analysis of a sample removed from the above washing step resulted in the detection of each of the above monomers (1), (2), (3) and (4). Furthermore, analysis of a sample removed from the above refining step resulted in the detection of oligomers and polymers in which the proportions of the monomers (1), (2), (3) and (4) were biased relative to the initial addition proportions.

The storage stability as a resist solution of the photoresist composition after storage for 3 months at room temperature was essentially unchanged from the stability observed immediately following production.

The number of pattern defects averaged no more than 5 defects per wafer. Using a measuring SEM S-9220 (manufactured by Hitachi, Ltd.), the defects were identified as so-called bridge type defects in which bridging occurs between line patterns.

Example 4

With the exception of using the monomers (1) to (4) described below, a photoresist resin (A-4) was synthesized by polymerization in the same manner as the example 1, and following washing and refining, a photoresist composition was prepared in the same manner as the example 1. The storage stability as a resist solution and the quantity of defects were then evaluated. The weight average molecular weight of the refined resist resin was 10,000.

(1) 40 mol % of α-gamma-butyrolactone methacrylate (corresponding with the structural unit (a1))

(2) 40 mol % of 2-methyl-2-adamantyl methacrylate (corresponding with the structural unit (a2-1))

(3) 15 mol % of 3-hydroxy-1-adamantyl methacrylate (corresponding with the structural unit (a3))

(4) 5 mol % of tetracyclododecane methacrylate (corresponding with the structural unit (a2-2))

Analysis of a sample removed from the above washing step resulted in the detection of each of the above monomers (1), (2), (3) and (4). Furthermore, analysis of a sample removed from the above refining step resulted in the detection of oligomers and polymers in which the proportions of the monomers (1), (2), (3) and (4) were biased relative to the initial addition proportions.

The storage stability as a resist solution of the photoresist composition after storage for 3 months at room temperature was essentially unchanged from the stability observed immediately following production.

The number of pattern defects averaged no more than 5 defects per wafer. Using a measuring SEM S-9220 (manufactured by Hitachi, Ltd.), the defects were identified as so-called bridge type defects in which bridging occurs between line patterns.

Example 5

With the exception of using the monomers (1) to (3) described below, a photoresist resin (A-5) was synthesized by polymerization in the same manner as the example 1, and following washing and refining, a photoresist composition was prepared in the same manner as the example 1. The storage stability as a resist solution and the quantity of defects were then evaluated. The weight average molecular weight of the refined resist resin was 10,000.

(1) 50 mol % of norbornanelactone acrylate (corresponding with the structural unit (a1), and equivalent to the monomer unit of the above structural formula (II) wherein R is a hydrogen atom)

(2) 30 mol % of 2-(1-adamantyl)-2-propyl acrylate (corresponding with the structural unit (a2-1), and equivalent to the monomer of the above general formula (VI) wherein R is a hydrogen atom, and $R^2$ and $R^3$ are methyl groups)

(3) 20 mol % of 3-hydroxy-1-adamantyl acrylate (corresponding with the structural unit (a3))

Analysis of a sample removed from the above washing step resulted in the detection of each of the above monomers (1), (2) and (3). Furthermore, analysis of a sample removed from the above refining step resulted in the detection of oligomers and polymers in which the proportions of the monomers (1), (2) and (3) were biased relative to the initial addition proportions.

The storage stability as a resist solution of the photoresist composition after storage for 3 months at room temperature was essentially unchanged from the stability observed immediately following production.

The number of pattern defects averaged no more than 5 defects per wafer. Using a measuring SEM S-9220 (manufactured by Hitachi, Ltd.), the defects were identified as so-called bridge type defects in which bridging occurs between line patterns.

Example 6

With the exception of using the monomers (1) to (3) described below, a photoresist resin (A-6) was synthesized by polymerization in the same manner as the example 1, and following washing and refining, a photoresist composition was prepared in the same manner as the example 1.The storage stability as a resist solution and the quantity of defects were then evaluated. The weight average molecular weight of the refined resist resin was 10,000.

(1) 50 mol % of α-gamma-butyrolactone methacrylate (corresponding with the structural unit (a1))

(2) 30 mol % of 2-methyl-2-adamantyl methacrylate (corresponding with the structural unit (a2-1))

(3) 20 mol % of 3-hydroxy-1-adamantyl methacrylate (corresponding with the structural unit (a3))

The storage stability as a resist solution of the photoresist composition after storage for 3 months at room temperature was essentially unchanged from the stability observed immediately following production.

The number of pattern defects averaged no more than 5 defects per wafer. Using a measuring SEM S-9220 (manufactured by Hitachi, Ltd.), the defects were identified as so-called bridge type defects in which bridging occurs between line patterns.

Example 7

With the exception of using the monomers (1) to (3) described below, a photoresist resin (A-7) was synthesized by polymerization in the same manner as the example 1, and following washing and refining, a photoresist composition was prepared in the same manner as the example 1. The storage stability as a resist solution and the quantity of defects were then evaluated. The weight average molecular weight of the refined resist resin was 10,000.

(1) 40 mol % of norbornanelactone methacrylate (corresponding with the structural unit (a1), and equivalent to the monomer of the above general formula (III) wherein R is a methyl group)

(2) 40 mol % of 2-ethyl-2-adamantyl methacrylate (corresponding with the structural unit (a2-1))

(3) 20 mol % of 3-hydroxy-1-adamantyl methacrylate (corresponding with the structural unit (a3))

The storage stability as a resist solution of the photoresist composition after storage for 3 months at room temperature was essentially unchanged from the stability observed immediately following production.

The number of pattern defects averaged no more than 5 defects per wafer. Using a measuring SEM S-9220 (manufactured by Hitachi, Ltd.), the defects were identified as so-called bridge type defects in which bridging occurs between line patterns.

Example 8

With the exception of using the monomers (1) to (3) described below, a photoresist resin (A-8) was synthesized by polymerization in the same manner as the example 1, and following washing and refining, a photoresist composition was prepared in the same manner as the example 1. The storage stability as a resist solution and the quantity of defects were then evaluated. The weight average molecular weight of the refined resist resin was 10,000.

(1) 40 mol % of a-gamma-butyrolactone methacrylate (corresponding with the structural unit (a1))

(2) 40 mol % of 1-ethyl-1-cyclohexyl methacrylate (corresponding with the structural unit (a2-1))

(3) 20 mol % of 3-hydroxy-1-adamantyl methacrylate (corresponding with the structural unit (a3))

The storage stability as a resist solution of the photoresist composition after storage for 3 months at room temperature was essentially unchanged from the stability observed immediately following production.

The number of pattern defects averaged no more than 5 defects per wafer. Using a measuring SEM S-9220 (manufactured by Hitachi, Ltd.), the defects were identified as so-called bridge type defects in which bridging occurs between line patterns.

Example 9

With the exception of using the monomers (1) to (3) described below, a photoresist resin (A-9) was synthesized by polymerization in the same manner as the example 1, and following washing and refining, a photoresist composition was prepared in the same manner as the example 1. The storage stability as a resist solution and the quantity of defects were then evaluated. The weight average molecular weight of the refined resist resin was 10,000.

(1) 40 mol % of α-gamma-butyrolactone methacrylate (corresponding with the structural unit (a1))

(2) 40 mol % of 2-methyl-2-adamantyl methacrylate (corresponding with the structural unit (a2-1))

(3) 20 mol % of 3-hydroxy-1-adamantyl methacrylate (corresponding with the structural unit (a3))

The storage stability as a resist solution of the photoresist composition after storage for 3 months at room temperature was essentially unchanged from the stability observed immediately following production.

The number of pattern defects averaged no more than 5 defects per wafer. Using a measuring SEM S-9220 (manufactured by Hitachi, Ltd.), the defects were identified as so-called bridge type defects in which bridging occurs between line patterns.

Example 10

With the exception of using the monomers (1) to (3) described below, a photoresist resin (A-10) was synthesized by polymerization in the same manner as the example 1, and following washing and refining, a photoresist composition was prepared in the same manner as the example 1. The storage stability as a resist solution and the quantity of defects were then evaluated. The weight average molecular weight of the refined resist resin was 10,000.

(1) 40 mol % of α-gamma-butyrolactone acrylate (corresponding with the structural unit (a1), and equivalent to the monomer of the above general formula (IV) wherein R is a hydrogen atom)

(2) 40 mol % of 2-methyl-2-adamantyl methacrylate (corresponding with the structural unit (a2-1))

(3) 20 mol % of 3-hydroxy-1-adamantyl methacrylate (corresponding with the structural unit (a3))

The storage stability as a resist solution of the photoresist composition after storage for 3 months at room temperature was essentially unchanged from the stability observed immediately following production.

The number of pattern defects averaged no more than 5 defects per wafer. Using a measuring SEM S-9220 (manufactured by Hitachi, Ltd.), the defects were identified as so-called bridge type defects in which bridging occurs between line patterns.

Example 11

0.1 mols of a monomer composition comprising the monomers (1) to (3) described below was dissolved in 150 ml of THF (tetrahydrofuran).

(1) 40 mol % of norbornanelactone methacrylate (corresponding with the structural unit (a1), and equivalent to the monomer of the above general formula (III) wherein R is a methyl group)

(2) 40 mol % of 2-ethyl-2-adamantyl methacrylate (corresponding with the structural unit (a2-1))

(3) 20 mol % of 3-hydroxy-1-adamantyl methacrylate (corresponding with the structural unit (a3))

A radical polymerization of the monomer composition was initiated at 70° C. using AIBN (4 mol % relative to 100 mol % of the above monomers), a compound represented by the chemical formula shown below (with a terminal structure pKa of approximately 7) was added as a polymerization chain transfer agent, in a quantity equivalent to 3 mol % relative to 100 mol % of the combination of the above monomers and AIBN, and a polymerization reaction was conducted.

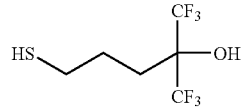

Following completion of the polymerization, the reaction liquid was poured into 2500 ml of methanol, the resulting mixture was stirred for 30 minutes at 25° C., and the precipitated solid was collected by filtration. This solid was then redissolved in 400 ml of tetrahydrofuran, poured into 2500 ml of methanol, the resulting mixture was stirred for 30 minutes at 25° C., and the precipitated crude resin was collected by filtration (the washing step).

30 g of the crude resin obtained in the manner described above was dissolved in 345 ml of PGMEA to prepare an 8% by weight (equivalent to Y) dilute resist resin solution. This dilute resist resin solution was filtered through a nylon filter (brand name: Ultipore N66, manufactured by Nihon Pall Ltd.) with a pore size of 0.04 μm. Subsequently, the thus obtained filtrate was filtered through a polypropylene filter (brand name: Unipore-Polyfix, manufactured by Kitz Corporation) with a pore size of 0.02 μm (the refining step). The resulting filtrate was concentrated and yielded a resist resin (A-11). The weight average molecular weight of (A-11) was 10,000. Analysis of a sample removed from the above washing step resulted in the detection of each of the above monomers (1), (2) and (3). Furthermore, analysis of a sample removed from the above refining step resulted in the detection of oligomers and polymers in which the proportions of the monomers (1), (2) and (3) were biased relative to the initial addition proportions.

The storage stability as a resist solution of the photoresist composition after storage for 3 months at room temperature was essentially unchanged from the stability observed immediately following production.

The number of pattern defects averaged no more than 5 defects per wafer. Using a measuring SEM S-9220 (manufactured by Hitachi Ltd.), the defects were identified as so-called bridge type defects in which bridging occurs between line patterns. The weight average molecular weight of the refined resist resin was 10,000.

Comparative Example 1

With the exception of not conducting the PGMEA dilution and filtering step (the refining step) on the resin obtained following the washing with the washing solvent in the example 1, a photoresist resin (A'-1) was produced in the same manner as the example 1. Subsequently, a photoresist was prepared in the same manner as the example 1 with the exception of replacing (A-1) with (A'-1).

As a result, the storage stability as a resist solution following one week storage at room temperature exceeded the measurement limit and was unable to be accurately measured.

The number of defects averaged approximately 60,000 defects per wafer. Using the aforementioned measuring SEM device, the defects were identified as so-called bridge type defects in which bridging occurs between line patterns.

Comparative Example 2

With the exception of not conducting the PGMEA dilution and filtering step (the refining step) on the resin obtained following the washing with the washing solvent in the example 2, a photoresist resin (A'-2) was produced in the same manner as the example 2. Subsequently, a photoresist was prepared in the same manner as the example 2 with the exception of replacing (A-2) with (A'-2).

As a result, the storage stability as a resist solution following one week storage at room temperature exceeded the measurement limit and was unable to be accurately measured.

The number of defects averaged approximately 60,000 defects per wafer. Using the aforementioned measuring SEM device, the defects were identified as so-called bridge type defects in which bridging occurs between line patterns.

Comparative Example 3

With the exception of not conducting the PGMEA dilution and filtering step (the refining step) on the resin obtained following the washing with the washing solvent in the example 3, a photoresist resin (A'-3) was produced in the same manner as the example 3. Subsequently, a photoresist was prepared in the same manner as the example 3 with the exception of replacing (A-3) with (A'-3).

As a result, the storage stability as a resist solution following one week storage at room temperature exceeded the measurement limit and was unable to be accurately measured.

The number of defects averaged approximately 60,000 defects per wafer. Using the aforementioned measuring SEM device, the defects were identified as so-called bridge type defects in which bridging occurs between line patterns.

Comparative Example 4

With the exception of not conducting the PGMEA dilution and filtering step (the refining step) on the resin obtained following the washing with the washing solvent in the example 4, a photoresist resin (A'-4) was produced in the same manner as the example 4. Subsequently, a photoresist was prepared in the same manner as the example 4 with the exception of replacing (A4) with (A'-4).

As a result, the storage stability as a resist solution following one week storage at room temperature exceeded the measurement limit and was unable to be accurately measured.

The number of defects averaged approximately 60,000 defects per wafer. Using the aforementioned measuring SEM device, the defects were identified as so-called bridge type defects in which bridging occurs between line patterns.

Comparative Example 5

With the exception of not conducting the PGMEA dilution and filtering step (the refining step) on the resin obtained following the washing with the washing solvent in the example 5, a photoresist resin (A'-5) was produced in the same manner as the example 5. Subsequently, a photoresist was prepared in the same manner as the example 5 with the exception of replacing (A-5) with (A'-5).

As a result, the storage stability as a resist solution following one week storage at room temperature exceeded the measurement limit and was unable to be accurately measured.

The number of defects averaged approximately 60,000 defects per wafer. Using the aforementioned measuring SEM device, the defects were identified as so-called bridge type defects in which bridging occurs between line patterns.

Comparative Example 6

With the exception of not conducting the PGMEA dilution and filtering step (the refining step) on the resin obtained following the washing with the washing solvent in the example 6, a photoresist resin (A'-6) was produced in the same manner as the example 6. Subsequently, a photoresist was prepared in the same manner as the example 6 with the exception of replacing (A-6) with (A'-6).

As a result, the storage stability as a resist solution following one week storage at room temperature exceeded the measurement limit and was unable to be accurately measured.

The number of defects averaged approximately 60,000 defects per wafer. Using the aforementioned measuring SEM device, the defects were identified as so-called bridge type defects in which bridging occurs between line patterns.

Comparative Example 7

With the exception of not conducting the PGMEA dilution and filtering step (the refining step) on the resin obtained following the washing with the washing solvent in the example 7, a photoresist resin (A'-7) was produced in the same manner as the example 7. Subsequently, a photoresist was prepared in the same manner as the example 7 with the exception of replacing (A-7) with (A'-7).

As a result, the storage stability as a resist solution following one week storage at room temperature exceeded the measurement limit and was unable to be accurately measured.

The number of defects averaged approximately 60,000 defects per wafer. Using the aforementioned measuring SEM device, the defects were identified as so-called bridge type defects in which bridging occurs between line patterns.

Comparative Example 8

With the exception of not conducting the PGMEA dilution and filtering step (the refining step) on the resin obtained following the washing with the washing solvent in the example 8, a photoresist resin (A'-8) was produced in the same manner as the example 8. Subsequently, a photoresist was prepared in the same manner as the example 8 with the exception of replacing (A-8) with (A'-8).

As a result, the storage stability as a resist solution following one week storage at room temperature exceeded the measurement limit and was unable to be accurately measured.

The number of defects averaged approximately 60,000 defects per wafer. Using the aforementioned measuring SEM device, the defects were identified as so-called bridge type defects in which bridging occurs between line patterns.

Comparative Example 9

With the exception of not conducting the PGMEA dilution and filtering step (the refining step) on the resin obtained following the washing with the washing solvent in the example 9, a photoresist resin (A'-9) was produced in the same manner as the example 9. Subsequently, a photoresist was prepared in the same manner as the example 9 with the exception of replacing (A-9) with (A'-9).

As a result, the storage stability as a resist solution following one week storage at room temperature exceeded the measurement limit and was unable to be accurately measured.

The number of defects averaged approximately 60,000 defects per wafer. Using the aforementioned measuring SEM device, the defects were identified as so-called bridge type defects in which bridging occurs between line patterns.

Comparative Example 10

With the exception of not conducting the PGMEA dilution and filtering step (the refining step) on the resin obtained following the washing with the washing solvent in the example 10, a photoresist resin (A'-10) was produced in the same manner as the example 10. Subsequently, a photoresist was prepared in the same manner as the example 10 with the exception of replacing (A-10) with (A'-10).

As a result, the storage stability as a resist solution following one week storage at room temperature exceeded the measurement limit and was unable to be accurately measured.

The number of defects averaged approximately 60,000 defects per wafer. Using the aforementioned measuring SEM device, the defects were identified as so-called bridge type defects in which bridging occurs between line patterns.

Comparative Example 11

With the exception of not conducting the PGMEA dilution and filtering step (the refining step) on the resin obtained following the washing with the washing solvent in the example 11, a photoresist resin (A'-11) was produced in the same manner as the example 11. Subsequently, a photoresist was prepared in the same manner as the example 11 with the exception of replacing (A-11) with (A'-11).

As a result, the storage stability as a resist solution following one week storage at room temperature exceeded the measurement limit and was unable to be accurately measured.

The number of defects averaged approximately 60,000 defects per wafer. Using the aforementioned measuring SEM device, the defects were identified as so-called bridge type defects in which bridging occurs between line patterns.

From the results of the examples and comparative examples described above it is evident that in the examples according to the present invention, employment of a refining process for a resist resin according to the present invention enables the effective removal of by-products from the crude resin, and as a result, the storage stability as a resist solution of a photoresist composition produced using the refined resin improves markedly. The quantity of defects on formation of a resist pattern can also be markedly reduced.

INDUSTRIAL APPLICABILITY

The present invention provides a process for effectively removing by-products such as polymers and oligomers contained within a resist resin, thereby refining a crude resist resin, as well as a resist resin produced by such a refining process, and a process for producing a chemically amplified photoresist composition using such a resist resin, and is consequently extremely useful in industry.

The invention claimed is:

1. A process for refining a crude resin of a resist resin (A) used in a photoresist composition comprising at least said resist resin (A) and an acid generator (B) dissolved in a first organic solvent (C1), comprising synthesizing a crude resin of said resist resin (A) followed by washing said synthesized crude reins of the resist resin (A) using a washing solvent by filtering off, and subsequently
   (i) preparing a crude resin solution comprising said washed crude resin of said resist resin (A) so that Y is smaller than X, and
   (ii) filtering said crude resin solution to obtain a filtrate containing a refined resin of said resist resin (A),
   wherein X represents a concentration of said resist resin (A) in said photoresist composition, and Y represents a concentration of said washed crude resin of said resist resin (A) in said crude resin solution dissolved in a second organic solvent (C2).

2. A process for refining a crude resin for a resist according to claim 1, wherein said X is within a range from 5 to 25% by weight, and said Y is less than a value of X selected from within said range.

3. A process for refining a crude resin for a resist according to claim 1, wherein said X is within a range from 7 to 20% by weight, and said Y is within a range from 2 to 10% by weight.

4. A process for refining a crude resin for a resist according to claim 1, wherein in said filtering step (ii), said solution is passed through a filter comprising a filtration membrane.

5. A process for refining a crude resin for a resist according to claim 4, wherein said filter is at least one filter selected from a group consisting of filters comprising filtration membranes formed from nylon, polyethylene and polypropylene.

6. A process for refining a crude resin for a resist according to claim 5, wherein in said filtering step (ii), said solution is passed through a filter comprising a nylon membrane, and is subsequently passed through a filter comprising a polyethylene or polypropylene membrane.

7. A process for refining a crude resin for a resist according to claim 1, wherein following said filtering step (ii), (iii) said filtered resist solution is concentrated.

8. A process for refining a crude resin for a resist according to claim 1, wherein a crude resin for a resist comprising (a1) structural units derived from a (meth)acrylate ester with a hydrophilic site is used as said crude resin of component (A).

9. A process for refining a crude resin for a resist according to claim 8, wherein said component (A) comprises at least 20 mol % of said (a1) units.

10. A process for refining a crude resin for a resist according to claim 8, wherein said hydrophilic site is a lactone unit.

11. A process for refining a crude resin for a resist according to claim 8, wherein said component (A) is a crude resin comprising said (a1) units and (a2) structural units derived from a (meth)acrylate ester containing a hydrophobic group.

12. A process for refining a crude resin for a resist according to claim 11, wherein said hydrophobic group in said (a2) units is an aliphatic polycyclic hydrocarbon group.

13. A process for refining a crude resin for a resist according to claim 11, wherein said component (A) is a crude resin comprising from 20 to 60 mol % of said (a1) units, and from 5 to 50 mol % of said (a2) units.

14. A process for refining a crude resin for a resist according to claim 8, wherein said component (A) is a crude resin formed solely from structural units derived from a methacrylate ester.

15. A process for refining a crude resin for a resist according to claim 8, wherein said component (A) is a crude resin comprising from 20 to 70 mol % of structural units derived from an acrylate ester, and from 30 to 80 mol % of structural units derived from a methacrylate ester.

16. A resist resin produced by a process according to claim 1.

17. A process for producing a photoresist composition using a resist resin according to claim 16.

18. A photoresist composition comprising a resist resin according to claim 16.

19. A process for refining a crude resin for a resist according to claim 1, wherein said washing solvent comprises one selected from methanol, ethanol, iso-propanol, n-hexane, and n-heptane.

20. A process for refining a crude resin for a resist according to claim 1, wherein said first organic solvent (C1) and said second organic solvent (C2) each independently comprises one selected from propylene glycol monomethyl ether acetate and ethyl lactate.

* * * * *